(12) United States Patent
Sugai et al.

(10) Patent No.: US 8,513,674 B2
(45) Date of Patent: Aug. 20, 2013

(54) SEMICONDUCTOR DEVICE AND METHOD OF MANUFACTURING THE SAME

(75) Inventors: Akihiko Sugai, Hanno (JP); Yasuyuki Sakaguchi, Chichibu (JP)

(73) Assignee: Showa Denko K.K., Tokyo (JP)

( * ) Notice: Subject to any disclaimer, the term of this patent is extended or adjusted under 35 U.S.C. 154(b) by 4 days.

(21) Appl. No.: 13/132,184

(22) PCT Filed: Nov. 25, 2009

(86) PCT No.: PCT/JP2009/006367
§ 371 (c)(1),
(2), (4) Date: Jun. 1, 2011

(87) PCT Pub. No.: WO2010/064382
PCT Pub. Date: Jun. 10, 2010

(65) Prior Publication Data
US 2011/0233563 A1   Sep. 29, 2011

(30) Foreign Application Priority Data
Dec. 2, 2008   (JP) ................. 2008-307533

(51) Int. Cl.
*H01L 31/0312*   (2006.01)
*H01L 29/24*   (2006.01)

(52) U.S. Cl.
USPC ........... 257/77; 257/339; 257/471; 257/473; 257/474; 257/E21.158; 257/E21.477; 257/E29.084; 438/571; 438/572; 438/576

(58) Field of Classification Search
USPC ........... 257/77, 339, 471, 473, 474, E21.158, 257/E21.477, E29.084; 438/571, 572, 576
See application file for complete search history.

(56) References Cited

U.S. PATENT DOCUMENTS

| 6,936,850 B2 * | 8/2005 | Friedrichs et al. ............ 257/77 |
| 7,615,839 B2 * | 11/2009 | Souma et al. ................. 257/473 |
| 7,851,881 B1 * | 12/2010 | Zhao et al. .................... 257/471 |
| 8,227,811 B2 * | 7/2012 | Mizukami et al. ............. 257/77 |
| 2008/0277668 A1 * | 11/2008 | Okuno et al. ................... 257/77 |

FOREIGN PATENT DOCUMENTS

| JP | 06-188163 A | 7/1994 |
| JP | 07-066433 A | 3/1995 |
| JP | 2001-015621 A | 1/2001 |
| JP | 2001-177096 A | 6/2001 |
| JP | 2002-314098 A | 10/2002 |
| JP | 2006-032665 A | 2/2006 |
| JP | 2006-261563 A | 9/2006 |

OTHER PUBLICATIONS

International Search Report for International Application No. PCT/JP2009/006367 dated Dec. 28, 2009.

\* cited by examiner

*Primary Examiner* — Dao H Nguyen
(74) *Attorney, Agent, or Firm* — Sughrue Mion, PLLC (57) ABSTRACT

A method of manufacturing of a semiconductor device (101) includes: a fine pattern forming step of forming p-type impurity regions (3, 4) and surface ohmic contact electrodes (5) using a stepper, after forming an N-type epitaxial layer (2) on a SiC single-crystal substrate (1); a protective film planarizing step of forming a protective film so as to cover the surface ohmic contact electrodes (5) and performing planarization of the protective film; a substrate thinning step of thinning the SiC single-crystal substrate (1); a backside ohmic contact electrode forming step of forming a backside ohmic contact electrode (7) on the SiC single-crystal substrate (1); a surface Schottky contact electrode forming step of forming a Schottky metal portion (8) connected to the p-type impurity regions (3, 4) and the surface ohmic contact electrodes (5); and a step of forming a surface pad electrode (9) that covers the Schottky metal portion (8).

5 Claims, 5 Drawing Sheets

SEMICONDUCTOR DEVICE AND METHOD OF MANUFACTURING THE SAME

TECHNICAL FIELD

The present invention relates to a semiconductor device and a method of manufacturing the same.

This application claims priority based on Japanese Patent Application No. 2008-307533 filed in the Japanese Patent Office on Dec. 2, 2008, the contents of which are incorporated herein by reference.

BACKGROUND ART

Hitherto, in the steps of creating semiconductor devices made of SiC, when an epitaxial layer is formed on the surface of a SiC single-crystal substrate, there have been cases where the epitaxial layer is formed on the backside of the SiC single-crystal substrate when gas that is generated passes around the substrate. In order to remove the epitaxial layer formed on the backside thereof, a step of polishing the backside of the SiC single-crystal substrate (hereinafter, referred to as the backside polishing step) has been carried out. Meanwhile, this backside polishing step also has an effect of lowering the on-resistance of a semiconductor device by thinning the substrate.

However, when the backside polishing step is performed, there have been cases where local thickness variation (referred to as the LTV: Local Thickness Variation) becomes large in the SiC single-crystal substrate. Moreover, the LTV is the difference between the maximum value and the minimum value of the thickness within a unit surface of the SiC single-crystal substrate, and for example, in an area of 10 mm$^2$ can range from 2 to 10 μm.

When the value of the LTV is larger than the focus depth (1 μm or so) of a stepper, a problem occurs in that even in the case of formation of a fine pattern of a semiconductor region using the stepper, a desired fine pattern cannot be formed, and thus it is impossible to create a semiconductor device having desired characteristics.

The semiconductor device includes, for example, a Schottky barrier diode. This Schottky barrier diode is a diode in which a Schottky barrier $\phi_b$ generated by the junction of a metal and a semiconductor is used, and has a feature that the forward voltage drop is low and the switching speed is high, compared to PN junction diodes. However, when a Schottky metal having a small Schottky barrier $\phi_b$ is used in order to further lower the forward voltage drop, there is also a defect that the reverse leakage current (hereinafter, referred to as the leakage current) is large and the reverse withstanding voltage is low. In addition, since the Schottky barrier diode is a unipolar device, there is also a defect that resistance to the forward surge current is low too. The semiconductor region made of a fine pattern is formed, whereby it is possible to improve a reverse withstanding voltage property, and to improve resistance to the forward surge current.

Particularly, in the Schottky barrier diode in which a PN junction region and a Schottky junction region are combined, when a gap of the PN junction region becomes wide because a fine pattern cannot be formed, the application of the reverse voltage increases an electric field of the Schottky junction region and increases the leakage current. In addition, since a Schottky metal having a small Schottky barrier $\phi_b$ cannot be used, there is a case where the forward voltage drop is increased. Further, the ratio of the area occupied by the Schottky junction region in the entire electrode is decreased, and thus there is a case where the voltage drop when the current flows in the forward direction is increased, leading to an increase in power loss.

For this reason, in the semiconductor device such as the Schottky barrier diode, it is essential to thin the substrate and to form the semiconductor region made of a fine pattern in order to improve the semiconductor properties.

PATENT DOCUMENT 1 relates to a method of manufacturing a semiconductor device chip and a semiconductor device, and discloses a wafer thinning step of forming a junction terminal after processing the backside thereof.

In addition, PATENT DOCUMENT 2 relates to a SiC single-crystal substrate for creating a semiconductor device and a method of manufacturing the same, and discloses a step of forming a SiC single-crystal substrate from a SiC single crystal ingot. In addition, PATENT DOCUMENT 3 relates to a method of manufacturing a SiC single-crystal substrate, and discloses a step of removing an altered portion of the SiC single-crystal substrate by etching in which reaction gas is used. Furthermore, PATENT DOCUMENT 4 relates to a light-emitting diode in which a current block layer is provided between a light-emitting section and a surface electrode. PATENT DOCUMENTs 2 to 4 disclose that dry etching of SiC is performed at an etching rate of several μm/h or so.

However, even when these methods are used, it is impossible to solve the aforementioned problems.

PATENT DOCUMENTS

[PATENT DOCUMENT 1] Japanese Unexamined Patent Application Publication No. 2001-15621

[PATENT DOCUMENT 2] Japanese Unexamined Patent Application Publication No. H6-188163

[PATENT DOCUMENT 3] Japanese Unexamined Patent Application Publication No. 2006-261563

[PATENT DOCUMENT 4] Japanese Unexamined Patent Application Publication No. 2006-32665

DISCLOSURE OF INVENTION

The invention is contrived in view of such circumstances, and an object thereof is to provide a semiconductor device in which a substrate is thinned and a semiconductor region made of a fine pattern is formed, and a method of manufacturing a semiconductor device.

In order to achieve the above-mentioned object, the invention adopts the following configurations. That is:

(1) A method of manufacturing a semiconductor device, including: a fine pattern forming step of forming an N-type epitaxial layer on the surface of a SiC single-crystal substrate, and then forming a p-type impurity region and a surface ohmic contact electrode, which are made of fine patterns, in the surface of the N-type epitaxial layer using a photolithography method in which a stepper is used; a protective film planarizing step of forming a protective film so as to cover the p-type impurity region and the surface ohmic contact electrode, and then performing planarization of the protective film; a substrate thinning step of reducing the thickness of the SiC single-crystal substrate; a backside ohmic contact electrode forming step of forming a backside ohmic contact electrode on the backside of the SiC single-crystal substrate; a surface Schottky contact electrode forming step of forming a Schottky metal portion connected to the p-type impurity region and the surface ohmic contact electrode; and a surface pad electrode forming step of forming a surface pad electrode so as to cover the Schottky metal portion after the surface Schottky contact electrode forming step.

(2) The method of manufacturing a semiconductor device according to the above (1), wherein the substrate thinning step is a step of polishing the backside of the SiC single-crystal substrate.

(3) The method of manufacturing a semiconductor device according to the above (1), wherein the substrate thinning step is a step of dry etching the backside of the SiC single-crystal substrate.

(4) A semiconductor device including: a SiC single-crystal substrate; an N-type epitaxial layer formed on the surface of the SiC single-crystal substrate; a p-type impurity region and a surface ohmic contact electrode, made of fine patterns, which are formed in the surface of the N-type epitaxial layer; a Schottky metal portion connected to the p-type impurity region and the surface ohmic contact electrode; a surface pad electrode formed so as to cover the Schottky metal portion; and a backside ohmic contact electrode formed on the backside of the SiC single-crystal substrate.

(5) The semiconductor device according to the above (4), wherein the thickness of the SiC single-crystal substrate is 150 to 350 μm.

According to the above-mentioned configurations, it is possible to provide a semiconductor device in which a substrate is thinned and a semiconductor region made of a fine pattern is formed, and a method of manufacturing a semiconductor device.

A method of manufacturing a semiconductor device of the invention includes: a fine pattern forming step of forming an N-type epitaxial layer on the surface of a SiC single-crystal substrate, and then forming a p-type impurity region and a surface ohmic contact electrode, which are made of fine patterns, in the surface of the N-type epitaxial layer using a photolithography method in which a stepper is used; a protective film planarizing step of forming a protective film so as to cover the p-type impurity region and the surface ohmic contact electrode, and then performing planarization of the protective film; a substrate thinning step of reducing the thickness of the SiC single-crystal substrate; a backside ohmic contact electrode forming step of forming a backside ohmic contact electrode on the backside of the SiC single-crystal substrate; a surface Schottky contact electrode forming step of forming a Schottky metal portion connected to the p-type impurity region and the surface ohmic contact electrode; and a surface pad electrode forming step of forming a surface pad electrode so as to cover the Schottky metal portion after the surface Schottky contact electrode forming step. Therefore, microfabrication is performed before the LTV is increased by the substrate thinning step, whereby it is possible to form the semiconductor device such as a Schottky barrier diode or a MOSFET having the semiconductor region which is made of a fine pattern. Through this substrate thinning, it is possible to reduce the on-voltage of the semiconductor device, to reduce the forward voltage drop when the current flows in the forward direction and to reduce power loss. In addition, the semiconductor region made of a fine pattern is formed, whereby it is possible to reduce the reverse leakage current when the reverse voltage is applied and to improve reliability of the semiconductor device.

DETAILED DESCRIPTION OF THE INVENTION

Hereinafter, an embodiment for carrying out the invention will be described.

EMBODIMENT

Figure 1:
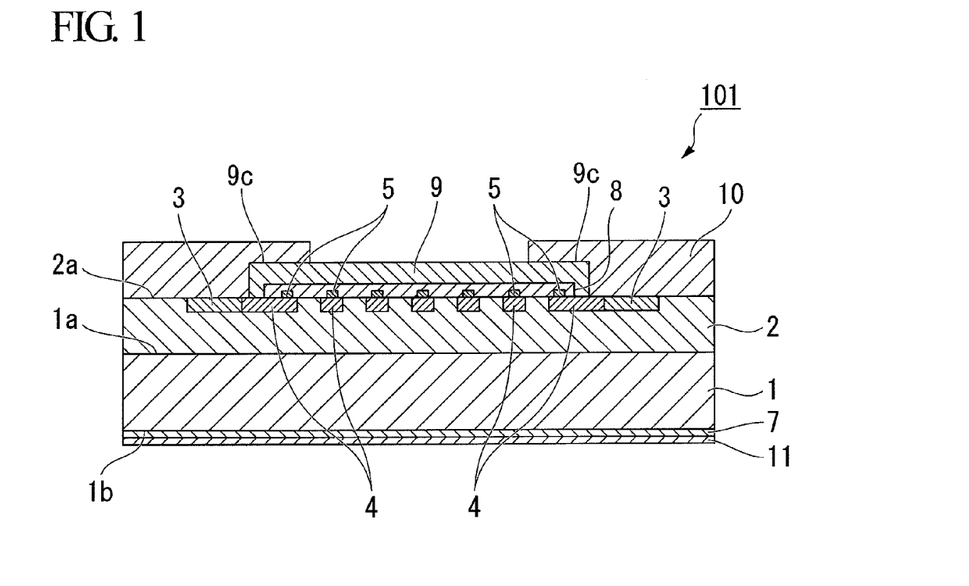
FIG. 1 is a schematic cross-sectional view illustrating a semiconductor device according to the invention.

FIG. 1 is a cross-sectional view illustrating an example of a semiconductor device which is an embodiment of the invention, and shows an example of a Schottky barrier diode in which a PN junction region and a Schottky junction region are combined.

As shown in FIG. 1, a semiconductor device 101 which is an embodiment of the invention roughly includes a SiC single-crystal substrate 1, an N-type epitaxial layer 2 formed on the surface 1a of a SiC single-crystal substrate 1, p-type impurity regions 3 and 4 and surface ohmic contact electrodes 5, made of fine patterns, which are formed in the surface 2a of the N-type epitaxial layer 2, a Schottky metal portion 8 connected to the p-type impurity regions 3 and 4 and the surface ohmic contact electrodes 5, a surface pad electrode 9 formed so as to cover the Schottky metal portion 8, a backside ohmic contact electrode 7 formed on a backside 1b of the SiC single-crystal substrate 1, and a backside pad electrode 11 formed so as to cover the backside ohmic contact electrode 7.

The SiC single-crystal substrate 1 is an N-type semiconductor substrate in which an N-type impurity is doped in a high concentration. The N-type epitaxial layer 2 is formed on the SiC single-crystal substrate 1, and a plurality of p-type impurity regions 3 and 4 is formed in the N-type epitaxial layer 2. Thereby, a PN junction region is formed in the interface between the p-type impurity regions 3 and 4 and the N-type epitaxial layer 2, and rectification of the semiconductor device 101 is improved. Meanwhile, it is possible to reduce the leakage current by narrowing the gap of the above-mentioned PN junction region.

Meanwhile, as described in a method of manufacturing a semiconductor device mentioned above, the p-type impurity regions 3 and 4 are composed of the low-concentration p-type impurity region 3 and the high-concentration p-type impurity region 4 due to the difference between the P-type impurity concentrations.

A Schottky barrier produced by the junction of a metal and a semiconductor is formed in the interface between the p-type impurity region 4 and the N-type epitaxial layer 2 and the Schottky metal portion 8, and a Schottky junction region is formed therein. Thereby, it is possible to lower the forward voltage drop of the semiconductor device 101, and to increase the switching speed.

Meanwhile, the voltage drop when the current flows in the forward direction is reduced by increasing the ratio of the area occupied by the Schottky junction region in the entire electrode, thereby allowing power loss to be reduced.

A passivation film 10 is formed by covering the end 9c of the surface pad electrode 9 and covering the whole surface 2a of the N-type epitaxial layer 2. The portion at which the surface pad electrode 9 is exposed serves as a terminal junction portion.

For example, when the semiconductor device 101 is mounted in an interconnection substrate (not shown), aluminum wire bonding is performed so as to connect one terminal portion of the above-mentioned interconnection substrate and the above-mentioned terminal junction portion, and the backside pad electrode 11 is joined to the other terminal portion of the interconnection substrate. Thereby, it is possible to apply a voltage to the backside pad electrode 11 and the surface pad electrode 9 of the semiconductor device 101.

The p-type impurity regions 3 and 4 and the surface ohmic contact electrodes 5 are preferably formed of fine patterns. Thereby, it is possible to reduce the leakage current when applying a reverse voltage and to improve reliability of the semiconductor device 101.

The thickness of the SiC single-crystal substrate 1 is preferably set to 150 to 350 μm. The thickness of the SiC single-crystal substrate 1 is set to 350 μm or less, whereby it is possible to reduce an on-voltage of the semiconductor device 101 which is a current value at which the forward current starts to flow. In addition, it is possible to reduce the forward voltage drop when the current is caused to flow in the forward direction and to reduce power loss. Meanwhile, when the thickness of the SiC single-crystal substrate 1 is less than 150 μm, it is not preferable because the strength of the semiconductor device is weak.

Meanwhile, the semiconductor device 101 is not limited to a Schottky barrier diode, but may be a MOSFET or the like.

Next, a method of manufacturing the semiconductor device 101 which is an embodiment of the invention will be described.

FIGS. 2 to 9 are process cross-sectional views for explaining an example of a method of manufacturing a semiconductor device which is an embodiment of the invention. Meanwhile, the same reference symbols are assigned to the same members as those shown in FIG. 1.

The method of manufacturing the semiconductor device 101 which is an embodiment of the invention includes a fine pattern forming step of forming the p-type impurity regions 3 and 4 and the surface ohmic contact electrodes 5, which are made of fine patterns, on the surface 1a of the SiC single-crystal substrate 1 using a photolithography method in which a stepper is used, a protective film planarizing step of forming a protective film 6 so as to cover the p-type impurity regions 3 and 4 and the surface ohmic contact electrodes 5, and then performing planarization of the protective film 6, a substrate thinning step of reducing the thickness of the SiC single-crystal substrate 1, a backside ohmic contact electrode forming step of forming the backside ohmic contact electrode 7 on the backside 1b of the SiC single-crystal substrate 1, a surface Schottky contact electrode forming step of forming the Schottky metal portion 8 connected to the p-type impurity regions 3 and 4 and the surface ohmic contact electrodes 5, and a surface pad electrode forming step of forming the surface pad electrode 9 so as to cover the Schottky metal portion 8 after the surface Schottky contact electrode forming step.

<Fine Pattern Forming Step>

Figure 2:
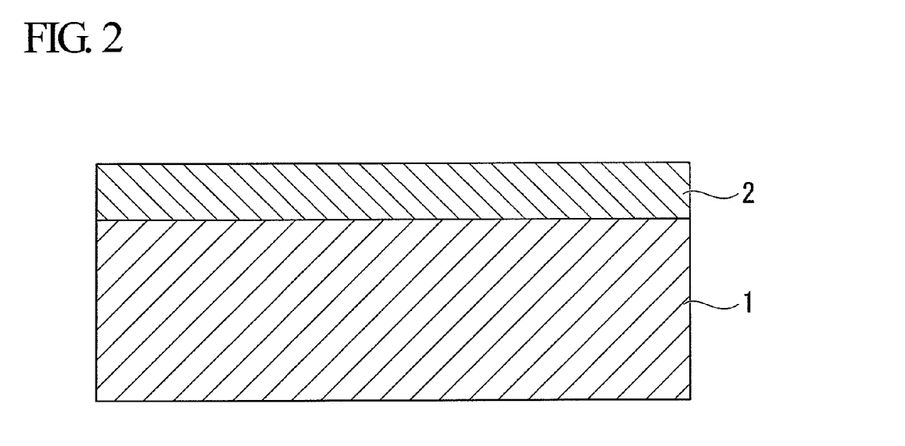
FIG. 2 is a process cross-sectional view illustrating a method of manufacturing the semiconductor device according to the invention.

First, as shown in FIG. 2, the N-type epitaxial layer 2 is formed on the SiC single-crystal substrate (N-type semiconductor substrate) 1.

Next, an oxide film is formed on the N-type epitaxial layer 2 by a CVD method.

Next, after a resist is applied onto the oxide film, a photoresist pattern is formed using a stepper. The photoresist pattern made of a fine pattern can be formed by using the stepper. Thereafter, a window portion is formed by dry etching the oxide film.

Next, aluminum or boron serving as a P-type impurity is ion-implanted in the N-type epitaxial layer 2 using the oxide film in which the window portion is formed as a mask. Then, after a resist is applied onto the oxide film again, a photoresist pattern is formed using a stepper, and then a window portion is formed by dry etching the oxide film. Next, aluminum or boron serving as a P-type impurity is ion-implanted in the N-type epitaxial layer 2 using the oxide film in which the window portion is formed as a mask. The oxide film is removed.

Figure 3:
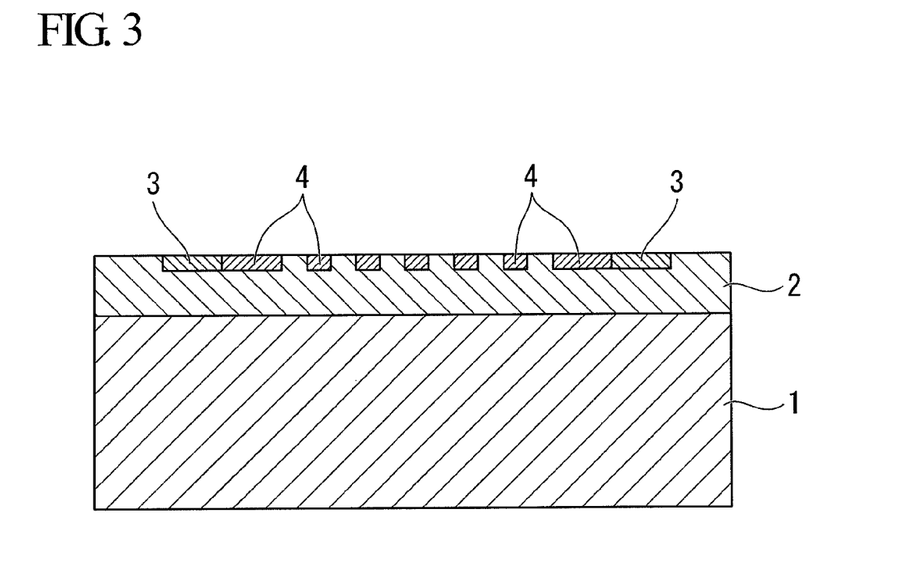
FIG. 3 is a process cross-sectional view illustrating the method of manufacturing the semiconductor device according to the invention.

Next, after a carbide film (for example, carbon film) is formed on the N-type epitaxial layer 2 by a sputtering method, high-temperature heat treatment (for example, heat treatment of 1,700° C.) is performed in an inert gas atmosphere or a vacuum in order to perform activation of the ion-implanted P-type impurity. Thereafter, the carbide film is removed. Thereby, the low-concentration p-type impurity region 3 and the high-concentration p-type region 4 are formed.

Meanwhile, the carbide film may be formed by performing heat treatment after organic matter is applied instead of the sputtering method.

FIG. 3 is a process cross-sectional view illustrating the state at a point in time after the low-concentration p-type impurity region 3 and the high-concentration p-type region 4 are formed.

Next, a two-layered metal film made of, for example, Ti/Al is formed on the N-type epitaxial layer 2 in which the p-type impurity regions 3 and 4 are formed, by a sputtering method or a vapor deposition method.

Next, after a resist is applied onto the metal film, a photoresist pattern is formed using a stepper. The photoresist pattern made of a fine pattern can be formed by using the stepper. Thereafter, the surface ohmic contact electrodes 5 are formed by dry etching the metal film. The surface ohmic contact electrodes 5 are connected to a plurality of high-concentration p-type regions 4, and ohmic contacts are formed therein.

<Protective Film Planarizing Step>

Figure 4:
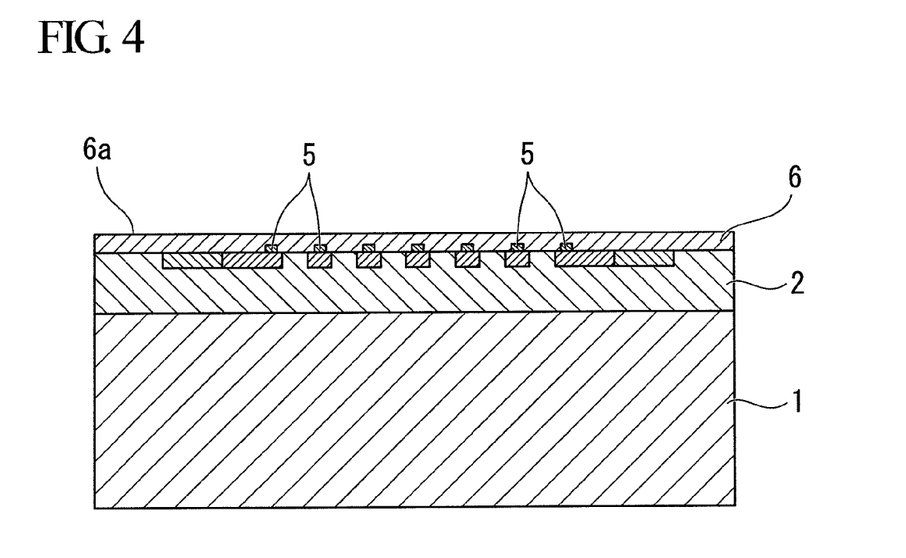
FIG. 4 is a process cross-sectional view illustrating the method of manufacturing the semiconductor device according to the invention.

The protective film 6 made of, for example, a silicon oxide film ($SiO_2$) is formed on the N-type epitaxial layer 2 on which the ohmic contact electrodes 5 are formed, by a CVD method.

Next, planarization of the protective film 6 is performed by a CMP (Chemical Mechanical Polishing) method. FIG. 4 is a process cross-sectional view illustrating the state at this point in time.

It is possible to planarize the backside 1b of the substrate 1 to be thinned by performing the next substrate thinning step based on the planarized surface 6a of the planarized protective film 6.

<Substrate Thinning Step>

Figure 5:
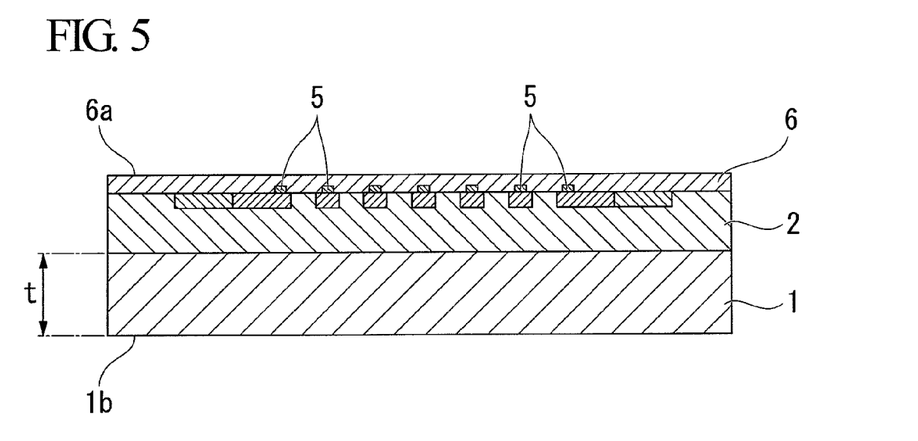
FIG. 5 is a process cross-sectional view illustrating the method of manufacturing the semiconductor device according to the invention.

As shown in FIG. 5, the thickness t of the SiC single-crystal substrate 1 is 150 to 350 μm by polishing the backside 1b of the SiC single-crystal substrate 1. The polishing means is not particularly limited, but well-known methods can be used therein.

Meanwhile, the SiC single-crystal substrate 1 may be thinned by dry etching the backside of the SiC single-crystal substrate. The thinning thereof can be performed efficiently.

<Backside Ohmic Contact Electrode Forming Step>

Figure 6:
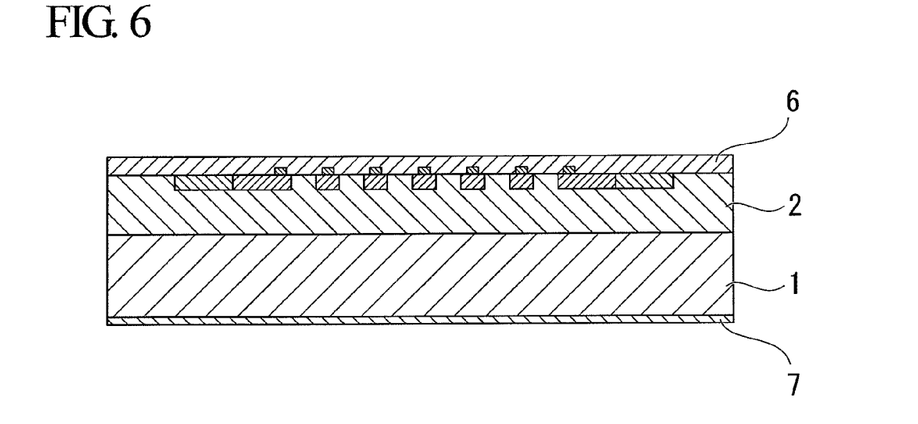
FIG. 6 is a process cross-sectional view illustrating the method of manufacturing the semiconductor device according to the invention.

A metal film made of, for example, Ni is formed on the backside of the SiC single-crystal substrate 1 in which the p-type impurity regions 3 and 4 are formed, by a sputtering method or a vapor deposition method.

Next, the backside ohmic contact electrode 7 is formed by performing heat treatment (for example, heat treatment of 950° C.) in an inert gas atmosphere or a vacuum. Thereby, in the backside ohmic contact electrode 7, the backside of the SiC single-crystal substrate 1 and the good ohmic contact are formed. FIG. 6 is a process cross-sectional view illustrating the state at this point in time.

Figure 7:
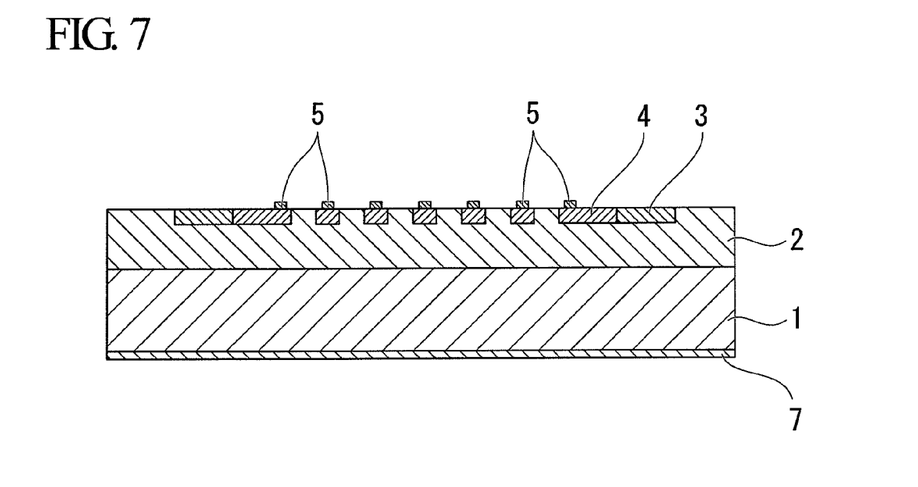
FIG. 7 is a process cross-sectional view illustrating the method of manufacturing the semiconductor device according to the invention.

Next, as shown in FIG. 7, the protective film 6 is removed.

<Surface Schottky Contact Electrode Forming Step>

Figure 8:
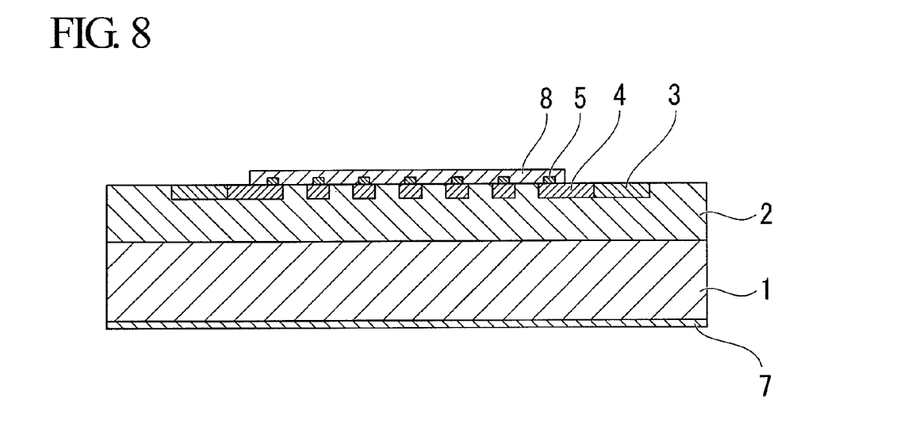
FIG. 8 is a process cross-sectional view illustrating the method of manufacturing the semiconductor device according to the invention.

Next, after a resist is applied onto the N-type epitaxial layer 2 on which the ohmic contact electrodes 5 are formed, the resist is exposed using a mirror projection aligner or a contact aligner having a large focus depth and then is developed, to thereby form a photoresist pattern. It is possible to achieve cost reductions in the manufacturing process by using a mirror projection aligner or contact aligner having a large focus depth.

Next, a metal film made of, for example, titanium, molybdenum, or the like is formed on the resist in which the window portion is formed, by a sputtering method or an vapor deposition method.

Next, it is possible to leave only the metal film formed in the window portion so as to cover the ohmic contact electrodes 5 by removing (lifting off) the resist.

Next, heat treatment (for example, heat treatment at 600° C.) for controlling a Schottky barrier $\phi_b$ is performed in an inert gas atmosphere, and the Schottky metal portion 8 is formed. The Schottky metal portion 8 is connected to the SiC single-crystal substrate 1, and a Schottky contact is formed therein. FIG. 8 is a process cross-sectional view illustrating the state at this point in time.

<Surface Pad Electrode Forming Step>

Figure 9:
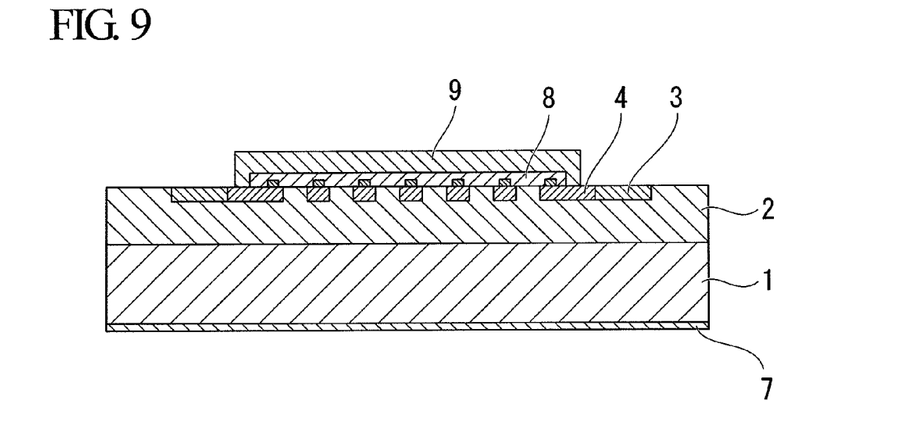
FIG. 9 is a process cross-sectional view illustrating the method of manufacturing the semiconductor device according to the invention.

Next, after a resist is applied onto the N-type epitaxial layer 2 on which the Schottky metal portion 8 is formed, the resist is exposed using the mirror projection aligner or the contact aligner having a large focus depth and then is developed, to thereby form a photoresist pattern.

Next, a metal film made of, for example, aluminum is formed on the resist in which the window portion is formed, by a sputtering method.

Next, it is possible to leave only the metal film formed in the window portion so as to cover the Schottky metal portion 8 by removing (lifting off) the resist.

Thereby, the surface pad electrode 9 connected to the Schottky metal portion 8 is formed. FIG. 9 is a process cross-sectional view illustrating the state at this point in time.

Figure 10:
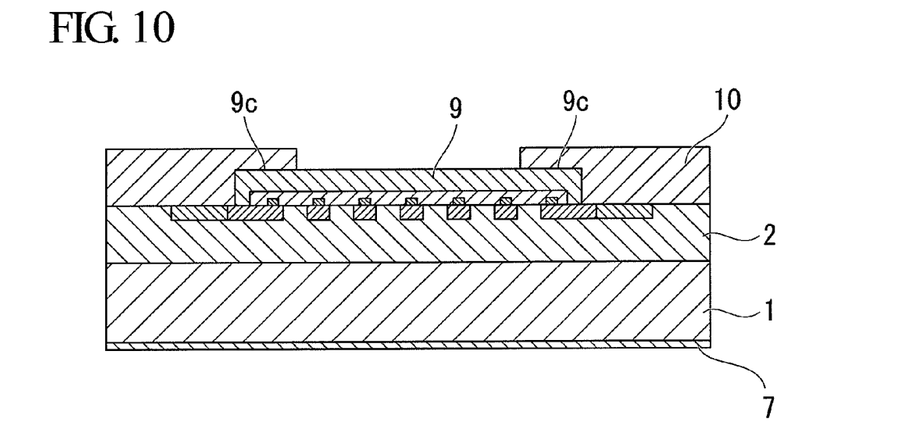
FIG. 10 is a process cross-sectional view illustrating the method of manufacturing the semiconductor device according to the invention.

Next, a passivation film is applied onto the N-type epitaxial layer 2 on which the surface pad electrode 9 is formed. As the passivation film, for example, a photosensitive polyimide film is used.

Next, the film is exposed using the mirror projection aligner or the contact aligner and then is developed, so that the patterned passivation film 10 is formed. FIG. 10 is a process cross-sectional view illustrating the state at this point in time. Here, a portion of the surface of the surface pad electrode 9 is exposed, and the passivation film 10 is formed so as to cover only the end 9c of the surface pad electrode 9.

Finally, as the backside pad electrode 11, a two-layered metal film made of, for example, Ni/Ag and the like is formed on the backside ohmic contact electrode 7 by a sputtering method.

The semiconductor device 101 shown in FIG. 1 is created through the above-mentioned steps.

The method of manufacturing the semiconductor device 101 which is an embodiment of the invention includes a fine pattern forming step of forming the p-type impurity regions 3 and 4 and the surface ohmic contact electrodes 5, which are made of fine patterns, on the surface 1a of the SiC single-crystal substrate 1 using a photolithography method in which a stepper is used, a protective film planarizing step of forming a protective film 6 so as to cover the p-type impurity regions 3 and 4 and the surface ohmic contact electrodes 5, and then performing planarization of the protective film 6, a substrate thinning step of reducing the thickness of the SiC single-crystal substrate 1, a backside ohmic contact electrode forming step of forming the backside ohmic contact electrode 7 on the backside 1b of the SiC single-crystal substrate 1, a surface Schottky contact electrode forming step of forming the Schottky metal portion 8 connected to the p-type impurity regions 3 and 4 and the surface ohmic contact electrodes 5, and a surface pad electrode forming step of forming the surface pad electrode 9 so as to cover the Schottky metal portion 8 after the surface Schottky contact electrode forming step. Therefore, microfabrication is performed before the LTV is increased by the substrate thinning step, whereby it is possible to form the semiconductor device 101, such as a Schottky barrier diode or a MOSFET having the semiconductor regions 3 and 4 which are made of fine patterns. By this substrate thinning, it is possible to reduce the on-voltage of the semiconductor device 101, to reduce the forward voltage drop when the current flows in the forward direction and to reduce power loss. In addition, the semiconductor regions 3 and 4 made of fine patterns are formed, whereby it is possible to reduce the reverse leakage current when the reverse voltage is applied, and to improve reliability of the semiconductor device 101.

In the method of manufacturing the semiconductor device 101 which is an embodiment of the invention, the substrate thinning step is a step of polishing the backside 1b of the SiC single-crystal substrate 1, and thus it is possible to thin the substrate efficiently.

In the method of manufacturing the semiconductor device 101 which is an embodiment of the invention, the substrate thinning step is a step of dry etching the backside 1b of the SiC single-crystal substrate 1, and thus it is possible to thin the substrate efficiently.

The semiconductor device 101 which is an embodiment of the invention includes the SiC single-crystal substrate 1, the N-type epitaxial layer 2 formed on the surface 1a of the SiC single-crystal substrate 1, the p-type impurity regions 3 and 4 and the surface ohmic contact electrodes 5, made of fine patterns, which are formed in the surface 2a of the N-type epitaxial layer 2, the Schottky metal portion 8 connected to the p-type impurity regions 3 and 4 and the surface ohmic contact electrodes 5, the surface pad electrode 9 formed so as to cover the Schottky metal portion 8, and the backside ohmic contact electrode 7 formed on the backside 1b of the SiC single-crystal substrate 1. Therefore, it is possible to reduce the reverse leakage current when the reverse voltage is applied, by narrowing the gap of the PN junction region. In addition, it is possible to increase the ratio of the area occupied by the Schottky junction region in the entire electrode, to reduce the voltage drop when the current flows in the forward direction and to reduce power loss. Thereby, it is possible to improve reliability of the semiconductor device 101.

In the semiconductor device 101 which is an embodiment of the invention, the thickness of the SiC single-crystal substrate 1 is set to 150 to 350 µm, and thus it is possible to reduce the on-voltage of the semiconductor device 101, to reduce the forward voltage drop when the current flows in the forward direction and to reduce power loss.

EXAMPLE

Hereinafter, detailed description will be made based on examples of the invention. However, the invention is not limited only to these examples.

Example 1

The semiconductor device shown in FIG. 1 was manufactured in the following conditions.

<Fine Pattern Forming Step>

First, the N-type epitaxial layer was formed on the SiC single-crystal substrate (N-type semiconductor substrate). Next, an oxide film was formed on the N-type epitaxial layer by a CVD method. Next, after a resist was applied onto the oxide film, a photoresist pattern made of a fine pattern was formed using a stepper. Thereafter, a window portion was formed by dry etching the oxide film. Next, aluminum serving as a P-type impurity was ion-implanted using the oxide film in which the window portion was formed as a mask. After a resist was applied onto the oxide film again, a photoresist pattern was formed using a stepper, and then an additional window portion was formed by dry etching the oxide film. Next, aluminum or boron serving as a P-type impurity was ion-implanted in the N-type epitaxial layer 2 once again using the oxide film in which the window portion was formed as a mask. Next, heat treatment of 1700° C. was performed in an inert gas atmosphere. Thereby, the low-concentration p-type impurity region and the high-concentration p-type region were formed.

Next, a two-layered metal film made of Ti/Al was formed on the N-type epitaxial layer in which the p-type impurity region was formed, by a sputtering method. Next, after a resist was applied onto the metal film, a photoresist pattern made of a fine pattern was formed using a stepper. Thereafter, the surface ohmic contact electrode was formed by dry etching the metal film.

<Protective Film Planarizing Step>

Next, the protective film made of a silicon oxide film (SiO₂) was formed on the N-type epitaxial layer on which the surface ohmic contact electrodes were formed, by a CVD method. Next, planarization of the protective film was performed by CMP.

<Substrate Thinning Step>

Next, the backside of the SiC single-crystal substrate 1 was polished, and the thickness of the SiC single-crystal substrate was approximately 250 µm. In a polishing method, mechanical polishing using a fine diamond slurry, which is a well-known method, was performed.

<Backside Ohmic Contact Electrode Forming Step>

Next, a metal film made of Ni was formed on the backside of the SiC single-crystal substrate on which the p-type impurity region was formed, by a sputtering method. Next, a heat treatment of 950° C. was performed in an inert gas atmosphere, and the backside ohmic contact electrode was formed. Next, the protective film was removed.

<Surface Schottky Contact Electrode Forming Step>

Next, after a resist was applied onto the N-type epitaxial layer on which the surface ohmic contact electrodes were formed, the resist was exposed using a mirror projection aligner having a large focus depth and then was developed, to thereby form a photoresist pattern. Next, a metal film made of titanium was formed on the resist in which the window portion was formed, by a sputtering method. After the resist was removed (lifted off), heat treatment at 600° C. was performed in an inert gas atmosphere, and a Schottky metal portion was formed.

<Surface Pad Electrode Forming Step>

Next, a resist was applied onto the N-type epitaxial layer on which the Schottky metal portion was formed, by a sputtering method, the resist was exposed using the mirror projection aligner having a large focus depth and was developed, to thereby form a photoresist pattern. Next, a metal film made of aluminum was formed on the resist in which the window portion was formed, by a sputtering method. The resist was removed (lifted off), and the surface pad electrode was formed.

Next, a passivation film made of a photosensitive polyimide film was applied onto the N-type epitaxial layer on which the surface pad electrode was formed. Next, the film was exposed using the mirror projection aligner and then was developed, to thereby form a patterned passivation film.

Finally, a two-layered metal film made of, for example, Ni/Ag was formed on the backside ohmic contact electrode by a sputtering method, and the backside pad electrode was formed. A semiconductor device A (sample of Example 1) shown in FIG. 1 was created by the aforementioned steps.

Comparative Example 1

Next, a semiconductor device B (sample of Comparative Example 1) was created similarly to Example 1 except that the p-type impurity region and the surface ohmic contact electrode were formed without using a stepper in the fine pattern forming step, and that the protective film planarizing step and the substrate thinning step were not performed.

Next, the difference between the rectifying characteristics of the semiconductor device A (sample of Example 1) and the semiconductor device B (sample of Comparative Example 1) was examined.

Figure 11:
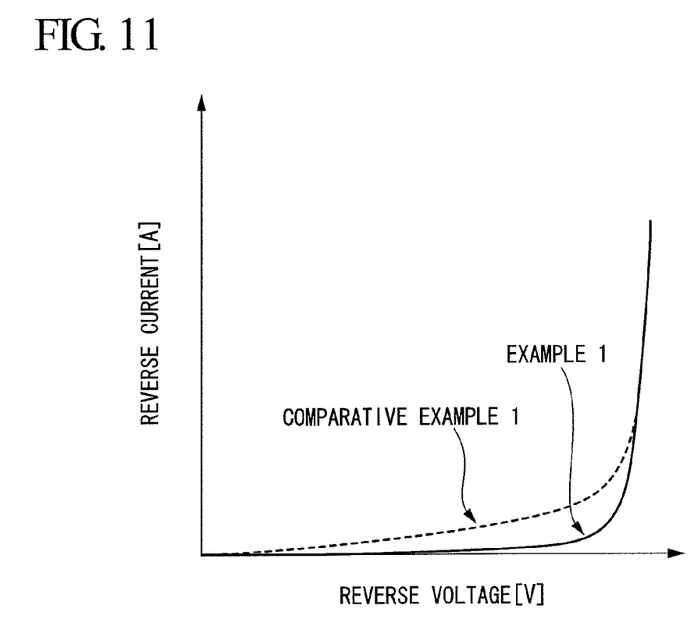
FIG. 11 is a graph illustrating the relationship between a reverse voltage and a reverse current.

FIG. 11 is a graph illustrating a value of the current (hereinafter, referred to as the reverse current) flowing in the reverse direction when the voltage was applied in the reverse direction. Here, the reverse current is a leakage current (hereinafter, referred to as the leakage current). As shown in FIG. 11, when the value of the reverse voltage was large, a result was obtained that the semiconductor device A (sample of Example 1) had a leakage current value lower than that of the semiconductor device B (sample of Comparative Example 1). That is, the leakage current was low, and thus reliability of the semiconductor device could be improved.

Figure 12:
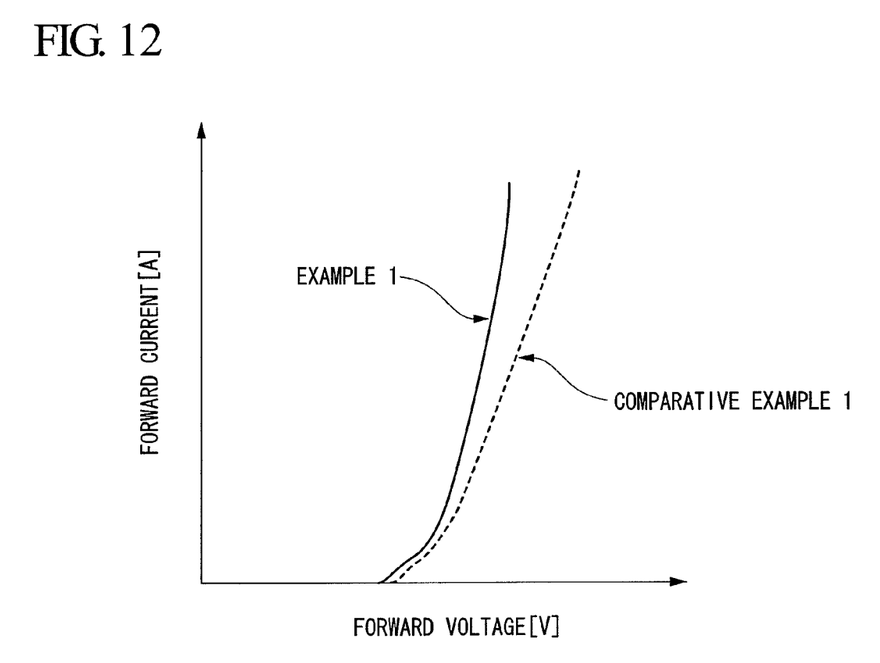
FIG. 12 is a graph illustrating the relationship between a forward voltage and a forward current.

FIG. 12 is a graph illustrating a value of the current (hereinafter, referred to as the forward current) flowing in the forward direction when the voltage was applied in the forward direction. As shown in FIG. 12, results were obtained that the semiconductor device A (sample of Example 1) had a voltage value when the forward current started to flow lower than that of the semiconductor device B (sample of Comparative Example 1), and that the tendency of I-V characteristics was higher than that. That is, it was possible to reduce the on-voltage of the semiconductor device A (sample of Example 1), and to reduce power loss.

INDUSTRIAL APPLICABILITY

The invention relates to a semiconductor device and a method of manufacturing the semiconductor device, and has applicability in the industrial field of the manufacture and use of semiconductor devices in which power loss is reduced by reducing the on-voltage, and reliability is improved by reducing the leakage current.

REFERENCE SYMBOLS

1: SiC SINGLE-CRYSTAL SUBSTRATE (N-TYPE SEMICONDUCTOR SUBSTRATE)
1a: SURFACE
1b: BACKSIDE
2: N-TYPE EPITAXIAL LAYER
2a: SURFACE
3: (LOW-CONCENTRATION P-TYPE) SEMICONDUCTOR REGION
4: (HIGH-CONCENTRATION P-TYPE) SEMICONDUCTOR REGION
5: (SURFACE) OHMIC CONTACT ELECTRODE
6: PROTECTIVE FILM
7: (BACKSIDE) OHMIC CONTACT ELECTRODE
8: SCHOTTKY METAL PORTION
9: (SURFACE) PAD ELECTRODE
9c: END
10: PASSIVATION FILM
11: (BACKSIDE) PAD ELECTRODE
101: SEMICONDUCTOR DEVICE

The invention claimed is:

1. A method of manufacturing a semiconductor device, comprising:
   a first fine pattern forming step comprising steps of forming an N-type epitaxial layer on the surface of a SiC single-crystal substrate, and then forming a p-type impurity region, which is made of fine patterns, in the surface of the N-type epitaxial layer using a photolithography method in which a stepper is used;
   a second fine pattern forming step of forming a surface ohmic contact electrode, which is made of fine patterns, on the surface of the p-type impurity region using a photolithography method in which a stepper is used;
   a protective film planarizing step of forming a protective film so as to cover the p-type impurity region and the surface ohmic contact electrode, and then performing planarization of the protective film;
   a substrate thinning step of reducing the thickness of the SiC single-crystal substrate;
   a backside ohmic contact electrode forming step of forming a backside ohmic contact electrode on the backside of the SiC single-crystal substrate;
   a protective film removing step of removing the protective film;
   a surface Schottky contact electrode forming step of forming a Schottky metal portion connected to the p-type impurity region and the surface ohmic contact electrode; and
   a surface pad electrode forming step of forming a surface pad electrode so as to cover the Schottky metal portion after the surface Schottky contact electrode forming step.

2. The method of manufacturing a semiconductor device according to claim 1, wherein the substrate thinning step is a step of polishing the backside of the SiC single-crystal substrate.

3. The method of manufacturing a semiconductor device according to claim 1, wherein the substrate thinning step is a step of dry etching the backside of the SiC single-crystal substrate.

4. The method of manufacturing a semiconductor device according to claim 1, wherein the material of the surface ohmic contact electrode is different from that of the Schottky metal portion.

5. The method of manufacturing a semiconductor device according to claim 4, wherein the surface ohmic contact electrode is a two-layered metal film made of Ti/Al, and the Schottky metal portion is made of titanium or molybdenum.

* * * * *